United States Patent [19]
Hadden et al.

[11] Patent Number: 5,281,855
[45] Date of Patent: Jan. 25, 1994

[54] INTEGRATED CIRCUIT DEVICE INCLUDING MEANS FOR FACILITATING CONNECTION OF ANTENNA LEAD WIRES TO AN INTEGRATED CIRCUIT DIE

[75] Inventors: Leonard D. Hadden, Minneapolis; Glen L. Zirbes, Silver Lake, both of Minn.

[73] Assignee: Trovan Limited, United Kingdom

[21] Appl. No.: 710,786

[22] Filed: Jun. 5, 1991

[51] Int. Cl.$^5$ ............... A01K 11/00; G01S 13/80; H01L 29/40
[52] U.S. Cl. ................... 257/784; 340/573; 342/51; 606/116
[58] Field of Search .............. 324/326–329; 340/571, 572, 825.54, 825.34, 573; 357/67, 71, 72; 342/42, 51; 343/718, 719, 742, 744, 787, 788, 873; 606/116, 117; 437/189, 213, 219; 257/734, 784, 786; H01Q 1/27, 1/40, 1/42, 1/00, 7/08, 7/06, 11/12

[56] References Cited

U.S. PATENT DOCUMENTS

| | | | |
|---|---|---|---|
| 3,609,741 | 9/1971 | Miller | 342/51 |
| 4,001,822 | 1/1977 | Sterzer | 342/51 |
| 4,017,886 | 4/1977 | Tomono et al. | 257/784 |
| 4,273,859 | 6/1981 | Mones et al. | 357/67 |
| 4,507,852 | 4/1985 | Karulkar | 357/67 |
| 4,805,232 | 2/1989 | Ma | 343/788 |
| 4,857,893 | 8/1989 | Carroll | 340/572 |
| 4,984,061 | 1/1991 | Matsumoto | 357/71 |
| 4,990,993 | 2/1991 | Tsurumaru | 357/71 |
| 4,992,794 | 2/1991 | Brouwers | 342/51 |
| 5,025,550 | 6/1991 | Zirbes et al. | 29/605 |
| 5,050,292 | 9/1991 | Zirbes et al. | 29/605 |
| 5,136,271 | 8/1992 | Nishioka et al. | 333/246 |
| 5,142,698 | 8/1992 | Koga et al. | 343/700 MS |

FOREIGN PATENT DOCUMENTS

8704900  8/1987  World Int. Prop. O. ......... 343/788

Primary Examiner—Rolf Hille
Assistant Examiner—Peter Toby Brown
Attorney, Agent, or Firm—Claude A. S. Hamrick

[57] ABSTRACT

A method and apparatus for facilitating interconnection of lead wires to an integrated circuit including the provision of an additional protective layer of insulation to the top of an integrated circuit chip or die and the provision of enlarged plated electrodes to the surface of the additional insulation to form enhanced bonding pads, such pads being electrically connected through the protective layers to the normal bonding pads of the integrated circuit device. The enhanced bonding pads are made of a soft conductive metal such that external wires to be attached thereto can be bonded to the pads using a thermal compression bonding technique.

12 Claims, 3 Drawing Sheets

INTEGRATED CIRCUIT DEVICE INCLUDING MEANS FOR FACILITATING CONNECTION OF ANTENNA LEAD WIRES TO AN INTEGRATED CIRCUIT DIE

BACKGROUND OF THE INVENTION

1. Field of the Invention

The present invention relates generally to the manufacture of miniature electronic devices and more particularly to a method and apparatus for facilitating the attachment of electromagnetic antenna wire leads to an integrated circuit chip used in a miniature transponder device suitable for implantation in a living animal.

This application is related to U.S. Pat. No. 5,025,550 (filed 05/25/90), entitled "Automated Method for the Manufacture of Small Implantable Transponder Devices", assigned to the assignee of the present invention.

2. Description of the Prior Art

As pointed out in the above-identified copending application the disclosure of which is hereby incorporated into this application by reference, miniature passive transponders of the type used for object identification, and particularly those which are implantable into living creatures, such as livestock, are very small and have inherent size restrictions that must be considered in their design and manufacture. Most such devices include a wire-wound electromagnetic antenna electrically connected to an integrated circuit which, in response to received transmitted energy obtained from the antenna, generates a response signal which is retransmitted to and through the antenna to a nearby sensor.

Heretofore, the integrated circuit was first mounted to a metal leadframe, potted, and then the potted device having leadframe leads extending therefrom was attached to the antenna by bonding the antenna wires to the leads. The necessity of providing a leadframe and assembling the semiconductor die to the leadframe not only adds to the cost of the device but also has a substantial bearing on the minimum size to which a particular device may be reduced.

SUMMARY OF THE PRESENT INVENTION

It is therefore a principal object of the present invention to provide a means for attaching fine wires directly to an integrated circuit without requiring the use of a leadframe structure.

Another object of the present invention is to provide a more economical means and method for attachment of fine wires to an integrated circuit than has heretofore been available.

Still another object of the present invention is to provide a novel means and method for attaching the antenna wires of a miniature transponder to an integrated circuit chip forming the operative electronic component thereof.

Briefly, a preferred embodiment of the present invention includes the provision of an additional protective layer of insulation to the top of an integrated circuit chip or die and the provision of enlarged plated electrodes to the surface of the additional insulation to form enhanced bonding pads, such pads being electrically connected through the protective layers to the normal bonding pads of the integrated circuit device. The enhanced bonding pads are made of a soft conductive metal such that external wires to be attached thereto can be bonded to the pads using a thermal compression bonding technique.

An important advantage of the present invention is that it reduces the cost and size of a passive transponder device.

Another advantage of the present invention is that it makes possible visible inspection of all circuit connections.

These and other objects and advantages of the present invention will no doubt become apparent to those skilled in the art after having read the following detailed description of the preferred embodiment which is illustrated in the several figures of the drawing.

IN THE DRAWING

DETAILED DESCRIPTION OF THE PREFERRED EMBODIMENTS

Figure 1:
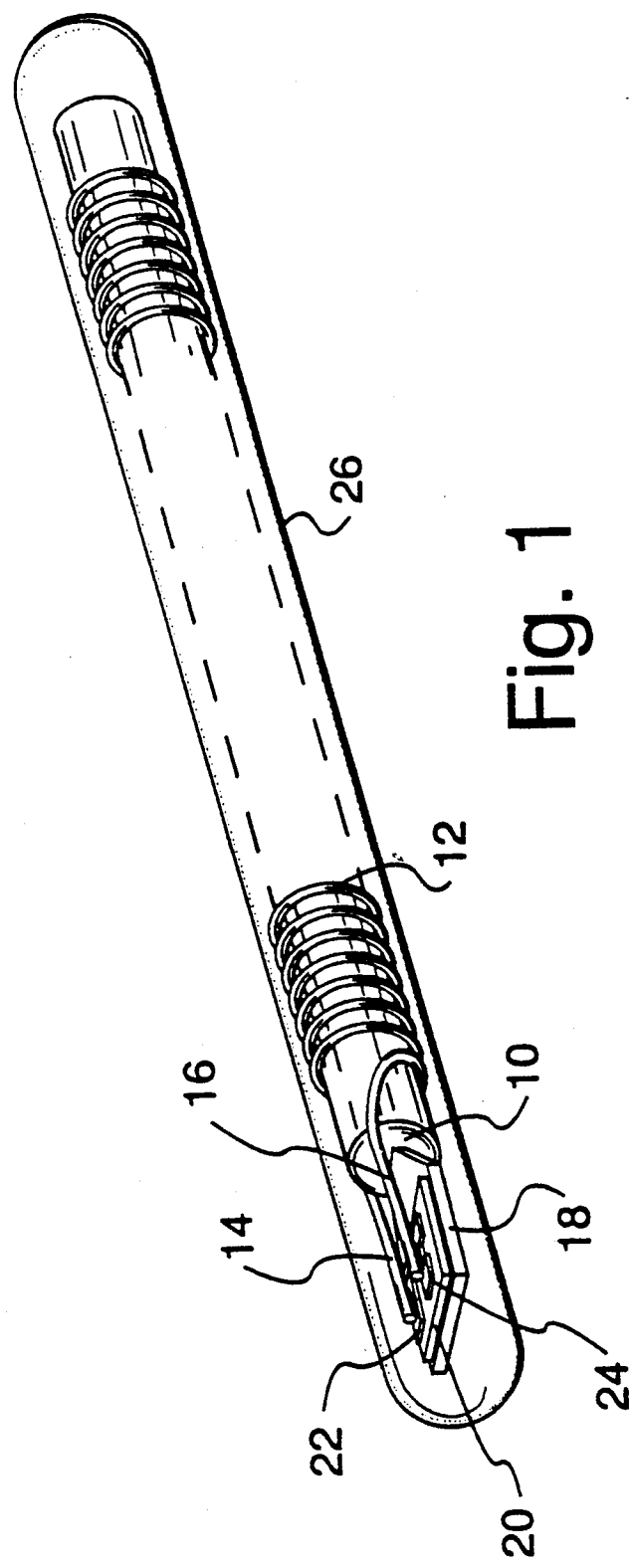
FIG. 1 is a perspective view illustrating an encapsulated transponder apparatus illustrating one application of the present invention.

Referring now to FIG. 1 of the drawing, there is shown a small implantable microtransponder device of the type generally described in the above-mentioned copending application but incorporating the present invention.

More specifically, the illustrated device includes an electromagnetic antenna formed of an elongated cylindrical magnetic core 10 having a length of ultra-fine conductive wire 12 wrapped thereabout with the ends 14 and 16 extending forwardly. One such antenna is disclosed in copending U.S. patent application Ser. No. 400,600, filed Aug. 30, 1989, and assigned to the assignee of the present invention. Affixed to the end of core 10 is a support means 18 to which is attached an integrated circuit die 20 having a pair of contact pads 22 and 24 provided thereon in accordance with the present invention. As depicted, the wire end 14 is conductively bonded to pad 22, and the wire end 16 is conductively bonded to pad 24. For some applications it may be possible to dispense with the support means 18 and depend entirely upon the wires 14 and 16 for support prior to subsequent encapsulation.

Note that since the pads 22 and 24 are installed during the wafer fabrication process, the only post-fab testing that need be undertaken is that relating to the bonding of wires 14 and 16 to the pads 22 and 24 respectively, and this can be easily accomplished using automated test equipment. In other words, the usual testing of chip-to-leadframe connection has been eliminated. After assembly and test, the transponder assembly is encapsulated in a suitable glass or plastic capsule 26 and is at this point ready for implantation in an animal or other object to be identified.

As described in the above-mentioned copending application, the die 20 includes electronic memory and associated modulation circuitry such that in response to power input thereto from the coil 12 generates an identifying signal which is returned to coil 12 for retransmission to a detecting antenna.

Figure 2:
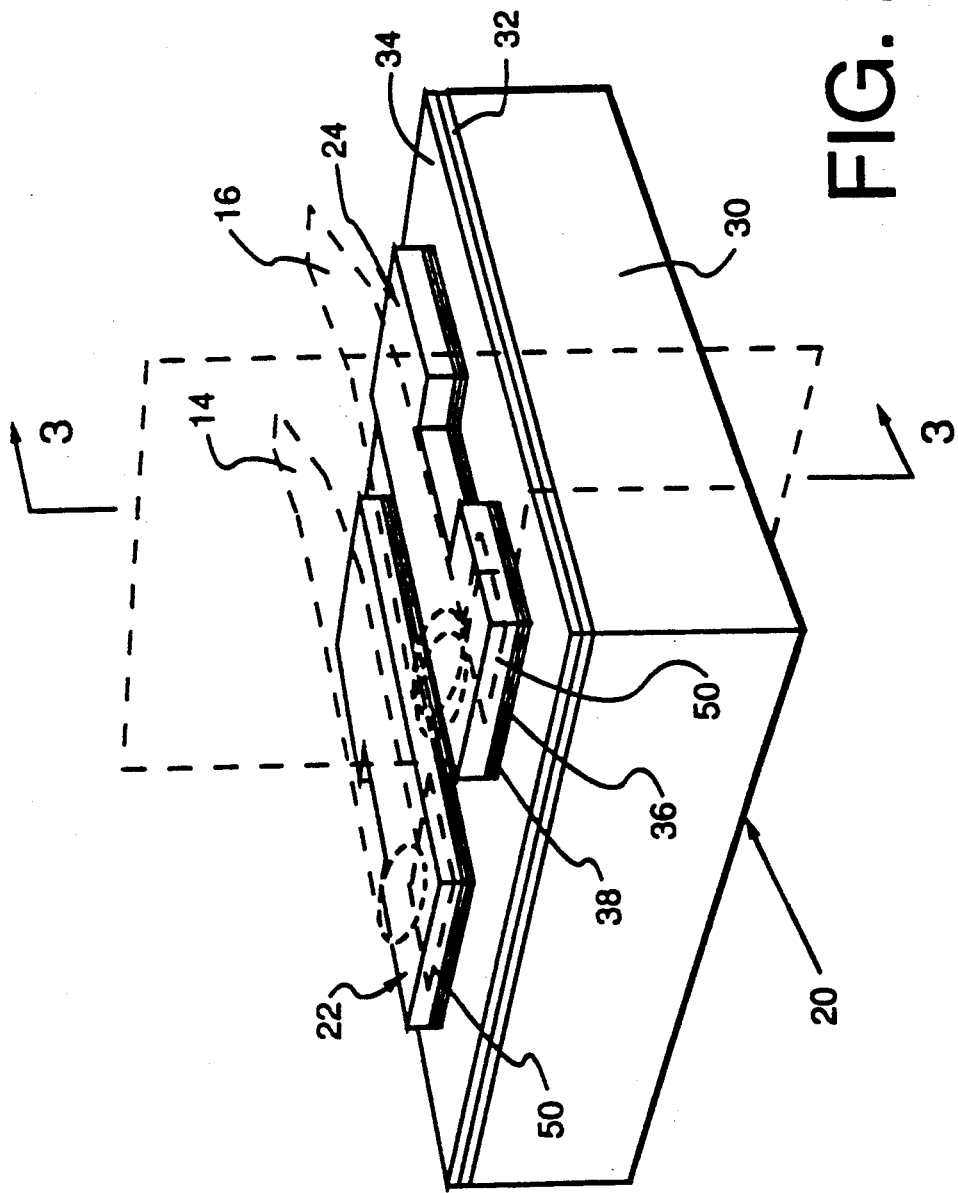
FIG. 2 is a perspective view more clearly illustrating a preferred embodiment of the present invention.

Turning now to FIG. 2 of the drawing, the die 20 is shown in enlarged detail to include a semiconductive substrate 30 having a standard phosphorus-doped glass layer 32 deposited thereon which is overcovered by a second layer of silicon nitride insulation 34 applied by plasma-enhanced deposition. The thickness of layer 34 is at least 15,000 angstroms and provides both insulation and structural protection for the underlying die. After deposition, the layer 34 is masked and two contact areas or holes 50 are etched through the layers 32 and 34 to contact the ac+ and ac− pads (not shown) on the circuit contained in die 20 beneath layer 32. With the contact areas open, the wafer is ready for the fabrication of the enhanced contact pads 22 and 24. The process starts with the deposition of a field metal layer 36 of TiW (approximately 90% Ti and 10% W) having a thickness of approximately 2,000 angstroms. On top of this layer a layer of pure gold of approximately 1,200 angstroms is deposited.

The enhanced contact pads 22 and 24 are then deposited to a thickness of approximately 25 microns of gold or copper. For the particular application illustrated, the pads 22 and 24 are approximately 16 milli-inches long and 6 milli-inches wide and provide adequate surface area to which the fine copper wires 14 and 16 may be attached by soldering, thermal compression bonding or welding. It should be noted that the thick silicon nitride il layer 34 is of particular importance to the invention in that the pads 22 and 24 are plated directly over the active circuit area, i.e. the layer 34 serves to protect against damage to the underlying circuitry during the wire lead attachment process which would otherwise render the assembly useless.

Figure 3:
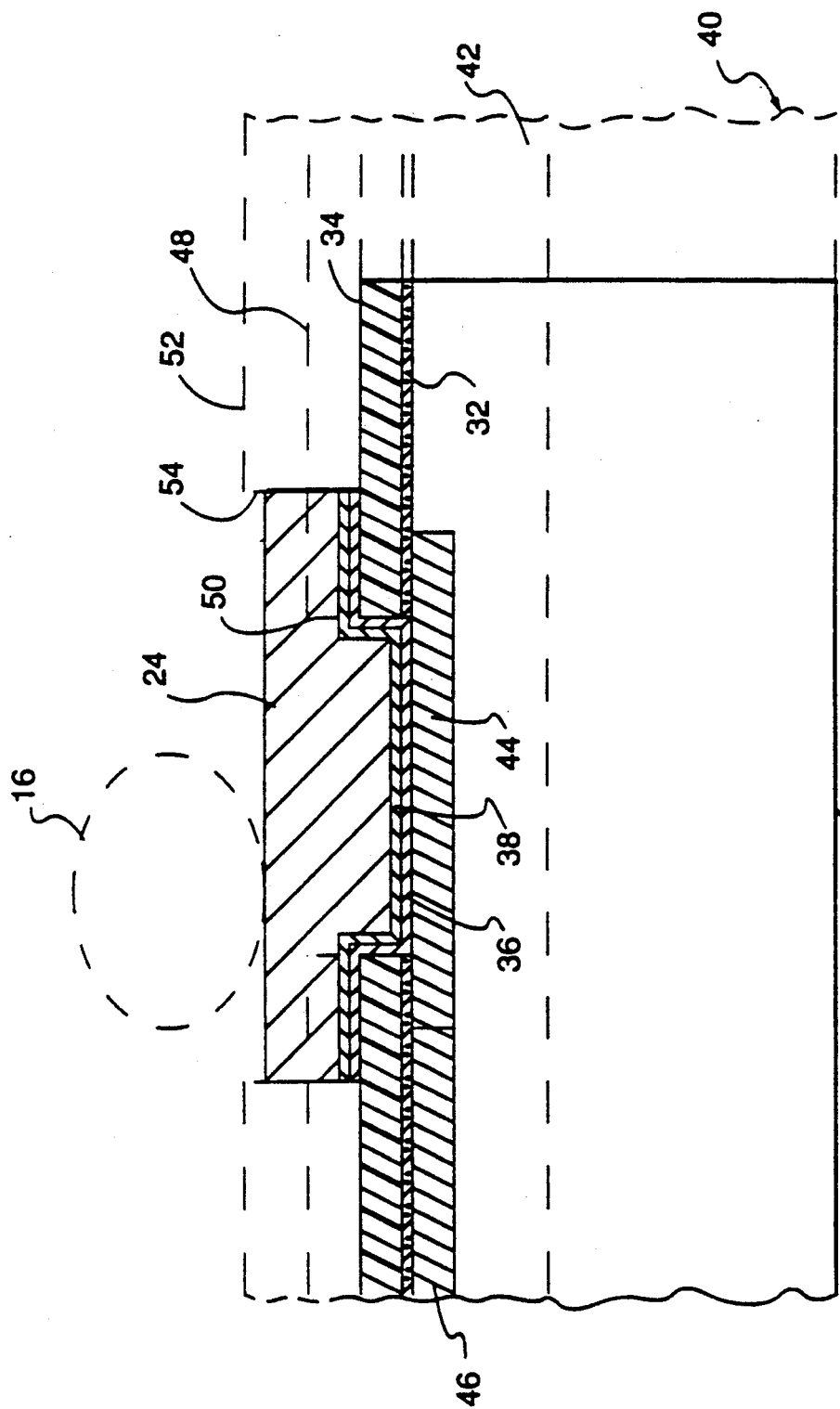
FIG. 3 is a transverse cross-section taken in the plane 3—3 of FIG. 2.

Referring now to FIG. 3 of the drawing, which is a partially broken cross-section taken along the plane 3—3 of FIG. 2, the manufacturing process is further illustrated, it being understood of course that the illustrated die is not fabricated individually but is made jointly with other die, forming a silicon wafer. After fabrication and test, the die 20 is separated from the other die of the wafer. As depicted, the wafer 40 from which the die 20 is cut forms a substrate the upper portion 42 of which has integrated circuit components formed therein. Deposited on the usual upper surface of the wafer and forming a standard electrical interconnect pad 44 is a metallization layer 46. A supporting leadframe is normally electronically connected to pads 44 by fine wires. However, in accordance with the present invention, no such leadframe and connecting wires are required and instead, as described above, after the wafer 40 is covered with the standard phosphorus-doped glass layer 32, it is then covered by a thick extra layer of silicon nitride insulation 34. The wafer is then covered with a layer of photoresist 48, and holes 50 are opened above each pad 44 (as suggested above, there are two for each die) to expose the standard contact pads 44.

After the pads 44 are open, a second layer 52 of photoresist of about 30 microns thickness is deposited over the wafer, and openings 54 are formed therein to define the enhanced pads 22 and 24 and reopen the holes 50. The field metal layers 36 and 38 are then deposited, typically using a DC-diode sputtering process, and subsequently the 25-micron thick enhanced pads 22 (FIG. 2) and 24 are electroplated onto the field metal. The photoresist is then removed, and the dies are severed from the wafer to yield the structure illustrated in FIG. 2. It will be understood of course that testing can be accomplished either before the dies are separated or afterwards.

Thereafter the die may be bonded to a support plate 18, as depicted in FIGS. 1 and 2, and the leads 14 and 16 are attached to the enhanced pads 22 and 24 respectively, by soldering, thermal compression bonding or welding. It will be appreciated that, although the wire attachment operation is made directly to a component part of the die, i.e. the enhanced pads 22 and 24 rather than to leadframes, as described in the previously mentioned copending application, the underlying circuit is protected by a combination of the layer 34 and the structural characteristics of the pads 22 and 24.

Although the present invention has been described in terms of an embodiment particularly suited for use in the fabrication of a microtransponder device, the same process can be used to make devices for a wide variety of applications.

Furthermore, although the present invention has been described above in terms of a single preferred embodiment, it is anticipated that numerous alterations and modifications thereof will become apparent to those skilled in the art. It is therefore intended that the appended claims be interpreted broadly as covering all such alterations and modifications as fall within the true spirit and scope of the invention.

What is claimed is:

1. An integrated circuit device comprising:
   a silicon substrate forming a die having an integrated signal processing circuit formed in a surface thereof and including a first set of contact pads;
   an insulative layer covering the circuit carrying surface of said die and having apertures therein exposing said first set of contact pads, said insulative layer having a thickness in excess of 10,000 angstroms;
   a plurality of second contact pads disposed over discrete surface areas of said insulative layer, each such area surrounding one of said apertures, and each such second contact pad contacting one of said first set of pads through a corresponding aperture, said second pads being of a relatively soft metal and having a thickness in excess of 20 microns, said second pads being substantially larger than the corresponding first contact pads; and
   means forming an electromagnetic antenna having wire leads bonded to said second pads, the size and thickness of said second pads combining with the thickness of said insulative layer to protect said integrated circuit during the bonding of each said wire lead to one of said second pads.

2. An integrated circuit device as recited in claim 1 wherein said integrated circuit and said electromagnetic antenna are configured to form a transponder device.

3. An integrated circuit device as recited in claim 2 and further comprising encapsulating means commonly encapsulating said die, said insulative layer, said second contact pads, and said antenna to form an implantable transponder device.

4. An integrated circuit device as recited in claim 1 wherein each of said wire leads is thermal compression bonded to its corresponding second pad.

5. An integrated circuit device as recited in claims 1, 2, 3, or 4, wherein said silicon substrate is supported by said wire leads.

6. An integrated circuit device as recited in claims 1, 2, 3, or 4, wherein said silicon substrate is supported by a support means attached to said electromagnetic antenna.

7. A miniature integrated circuit transponder device comprising:

a semiconductor substrate having an integrated signal processing circuit formed thereon, said integrated circuit including a plurality of discrete contact pads for facilitating electrical interconnection thereto;

an electrically insulative layer covering said integrated circuit and having apertures formed therein exposing said contact pads, said insulative layer having a thickness in excess of 10,000 angstroms;

a plurality of bonding pads disposed over said insulative layer, with each said bonding pad extending through one of said apertures to make electrical contact with one of said contact pads, each said bonding pad being of a relatively soft metal having a thickness of at least 20 microns and having a surface area overlying a portion of said insulative layer substantially larger than the area of its corresponding aperture; and electromagnetic antenna means having lead wires bonded to corresponding ones of said bonding pads, the size and thickness of said bonding pads and said insulative layer being sufficient to protect said substrate and said integrated circuit during the bonding of said lead wires to said bonding pads.

8. A miniature integrated circuit transponder device as recited in claim 7 wherein said lead wires are thermal compression bonded to their corresponding bonding pads.

9. A miniature integrated circuit transponder device as recited in claims 7 or 8 wherein said substrate is supported by said lead wires.

10. A miniature integrated circuit transponder device as recited in claim 9 wherein said bonding pads have a width larger than the diameter of said lead wires and a length of more than twice their width.

11. A miniature integrated circuit transponder device as recited in claims 7 or 8 wherein said substrate is supported by support means attached to said electromagnetic antenna means.

12. A miniature integrated circuit transponder device as recited in claim 11 wherein said bonding pads have a width larger than the diameter of said lead wires and a length of more than twice their width.

* * * * *

UNITED STATES PATENT AND TRADEMARK OFFICE
CERTIFICATE OF CORRECTION

PATENT NO. : 5,281,855
DATED : January 25, 1994
INVENTOR(S) : Leonard D. Hadden, Glen L. Zirbes and Ake Gustafson It is certified that error appears in the above-identified patent and that said Letters Patent is hereby corrected as shown below:

Title page,
Item [75], Inventors, add -- Ake Gustafson, Torp Senoren, Sweden --.

Signed and Sealed this

Fifth Day of October, 2004

JON W. DUDAS
*Director of the United States Patent and Trademark Office*